(12) United States Patent
Ikeda

(10) Patent No.: US 10,101,412 B2
(45) Date of Patent: Oct. 16, 2018

(54) SENSING DEVICE AND METHOD FOR MANUFACTURING SENSING DEVICE

(71) Applicant: Hitachi Metals, Ltd., Tokyo (JP)

(72) Inventor: Yukio Ikeda, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 20 days.

(21) Appl. No.: 14/896,631

(22) PCT Filed: Jun. 9, 2014

(86) PCT No.: PCT/JP2014/065257
§ 371 (c)(1),
(2) Date: Dec. 7, 2015

(87) PCT Pub. No.: WO2014/199956
PCT Pub. Date: Dec. 18, 2014

(65) Prior Publication Data
US 2016/0124056 A1    May 5, 2016

(30) Foreign Application Priority Data
Jun. 10, 2013    (JP) ................. 2013-121473

(51) Int. Cl.
*G01R 33/00* (2006.01)
*G01R 33/07* (2006.01)
(Continued)

(52) U.S. Cl.
CPC ........... *G01R 33/072* (2013.01); *G01D 5/145* (2013.01); *G01D 5/2451* (2013.01);
(Continued)

(58) Field of Classification Search
CPC .. G01R 33/12; G01R 33/072; G01R 33/0052; G01R 33/07; G01R 33/02; G01D 5/145;
(Continued)

(56) References Cited

U.S. PATENT DOCUMENTS 4,649,447 A  *  3/1987  Huang et al. .............. 360/327.1
5,227,761 A  *  7/1993  Sugimoto et al. .......... 338/32 R
(Continued)

FOREIGN PATENT DOCUMENTS

EP    1 505 380 A2    2/2005
JP    S63-135272 U    9/1988
(Continued)

OTHER PUBLICATIONS

Extended European Search Report dated Jan. 5, 2017.
(Continued)

*Primary Examiner* — Patrick Assouad
*Assistant Examiner* — Demetrius Pretlow
(74) *Attorney, Agent, or Firm* — McGinn I.P. Law Group, PLLC.

(57) ABSTRACT

A sensor module includes a magnetic field sensor that includes a sensor main body including a magnetic field sensing element and a plurality of lead wires led out from the sensor main body, a container case including a container part that includes the sensor main body, and a molded body that includes a mold resin molded so as to include at least a part of the container case without contacting with the sensor main body.

20 Claims, 7 Drawing Sheets

(51) Int. Cl.
*G01P 3/487* (2006.01)
*G01D 5/14* (2006.01)
*G01D 5/245* (2006.01)
*G01D 11/24* (2006.01)
*G01P 3/44* (2006.01)
*G01L 5/22* (2006.01)
*G01B 7/30* (2006.01)

(52) U.S. Cl.
CPC ............ *G01D 11/245* (2013.01); *G01L 5/221* (2013.01); *G01P 3/44* (2013.01); *G01P 3/443* (2013.01); *G01P 3/487* (2013.01); *G01R 33/0052* (2013.01); *G01R 33/07* (2013.01)

(58) Field of Classification Search
CPC .... G01D 5/2451; G01D 11/245; G01L 5/221; G01P 3/44; G01P 3/443; G01P 3/487; B61K 9/10; G01N 27/9033; G01N 27/9093; G01N 27/9013; G01N 27/902; B82Y 25/00
USPC ......................................................... 324/261
See application file for complete search history.

(56) References Cited

U.S. PATENT DOCUMENTS

| 5,698,778 | A | * | 12/1997 | Ban et al. ................. 73/114.36 |
| 7,143,651 | B2 | | 12/2006 | Sasaki et al. |
| 2004/0135574 | A1 | * | 7/2004 | Hagio et al. ............. 324/207.25 |
| 2005/0061080 | A1 | | 3/2005 | Sasaki et al. |
| 2008/0121831 | A1 | | 5/2008 | Ikeda |
| 2011/0260719 | A1 | * | 10/2011 | Mase et al. .............. 324/207.25 |
| 2011/0290016 | A1 | | 12/2011 | Dietrich et al. |
| 2012/0291542 | A1 | | 11/2012 | Fujita et al. |

FOREIGN PATENT DOCUMENTS

| JP | S63-185519 U | 11/1988 |
| JP | 2005-265581 A | 9/2005 |
| JP | 2008-128647 A | 6/2008 |
| JP | 2012-512405 A | 5/2012 |
| JP | 2013-088335 A | 5/2013 |

OTHER PUBLICATIONS

Chinese Office Action dated Nov. 1, 2016 with an English translation thereof.
International Search Report (ISR) (PCT Form PCT/ISA/210), in PCT/JP2014/065257, dated Sep. 9, 2014.
Japanese Office Action dated Mar. 3, 2017 with an English translation thereof.
Chinese Office Action, dated Jul. 7, 2017, in Chinese Application No. 201480032723.8 and English Translation thereof.

* cited by examiner

SENSING DEVICE AND METHOD FOR MANUFACTURING SENSING DEVICE

TECHNICAL FIELD

The present invention relates to a sensing device with a sensor for detecting a state quantity such as magnetic field or temperature, and a method for manufacturing the sensing device.

BACKGROUND ART

A torque sensor is known which has e.g., a Hall IC as a sensor for detecting a magnetic field molded in a resin and detects torque applied to a steering wheel of a vehicle based on variation in strength of a magnetic field detected by the Hall IC (see e.g., PTL 1).

The torque sensor disclosed in PTL 1 is provided with an input shaft connected to a steering wheel, an output shaft connected to a steered wheel, a torsion bar coupling the input shaft to the output shaft, a multipole magnet, a pair of multipolar yokes and two Hall ICs, and is configured that twisting of the torsion bar due to torque applied to the steering wheel causes relative rotation of the multipole magnet and the pair of multipolar yokes. A pair of annular magnetic collecting rings is arranged around the pair of multipolar yokes, and a magnetic collecting portion protruding in a radial direction is provided on each of the magnetic collecting rings at a circumferential position. The two Hall ICs are arranged between the magnetic collecting portion of one magnetic collecting ring and the magnetic collecting portion of the other magnetic collecting ring.

Where the multipole magnet rotates relative to the pair of multipolar yokes, the strength of the magnetic field detected by the Hall ICs is changed according to the relative rotation angle. Thus, a torque applied to the steering wheel can be detected based on this change in the magnetic field strength. The two Hall ICs are molded in a resin member together with the pair of magnetic collecting rings.

CITATION LIST

Patent Literature

[PTL 1]
JP-A-2005-265581

SUMMARY OF INVENTION

Technical Problem

In molding the annular resin member, however, the two Hall ICs are arranged in a molding space of a mold and a molten resin is injected into the molding space and comes into contact with the Hall ICs inside the molding space. Since the injected molten resin is very hot, e.g. 270° C., heat during the molding may cause a decrease in detection accuracy of the Hall ICs.

Thus, it is an object of the invention to provide a sensing device that can prevent a decrease in detection accuracy of a sensor due to heat during resin molding of the sensor, as well as a method for manufacturing the sensing device.

Solution to Problem

According to an embodiment, the invention provides a sensing device comprising a sensor that comprises a sensor main body comprising a sensing element and a plurality of lead wires led out from the sensor main body, a housing member that comprises a container part comprising the sensor main body, and a molded body that comprises a mold resin molded so as to include at least a part of the housing member without contacting with the sensor main body.

Also, according to an embodiment, the invention provides a method for manufacturing a sensing device, comprising a first step for housing at least a sensor main body of a sensor in a container part of a housing member, sensor comprising the sensor main body comprising a sensing element and a plurality of lead wires led out from the sensor main body, and a second step for molding a mold resin so as to include at least a part of the housing member without contacting a molten resin with the sensor main body.

Advantageous Effects of Invention

The sensing device and the method for manufacturing a sensing device according to the invention can prevent a decrease in detection accuracy of a sensor due to heat upon molding the sensor with the resin.

BRIEF DESCRIPTION OF DRAWINGS

FIGS. 5A to 5C show a container case constituting the sensor module of FIG. 4, wherein FIG. 5A is a cross sectional view showing the container case (not including a molded body) taken on line A-A, FIG. 5B is a front view showing a second resin member constituting the container case, and FIG. 5C is a top view showing the container case.

FIGS. 6A and 6B show a sensor module in a second embodiment of the invention, wherein FIG. 6A is a cross sectional view showing the sensor module and FIG. 6B is a bottom view showing the sensor module.

FIGS. 7A to 7C show a container case constituting the sensor module in the second embodiment, wherein FIGS. 7A and 7B are perspective views showing the container case and FIG. 7C is a side view showing the container case.

DESCRIPTION OF EMBODIMENTS

First Embodiment

The embodiment of the invention will be described in reference to FIGS. 1 to 5.

Figure 1:
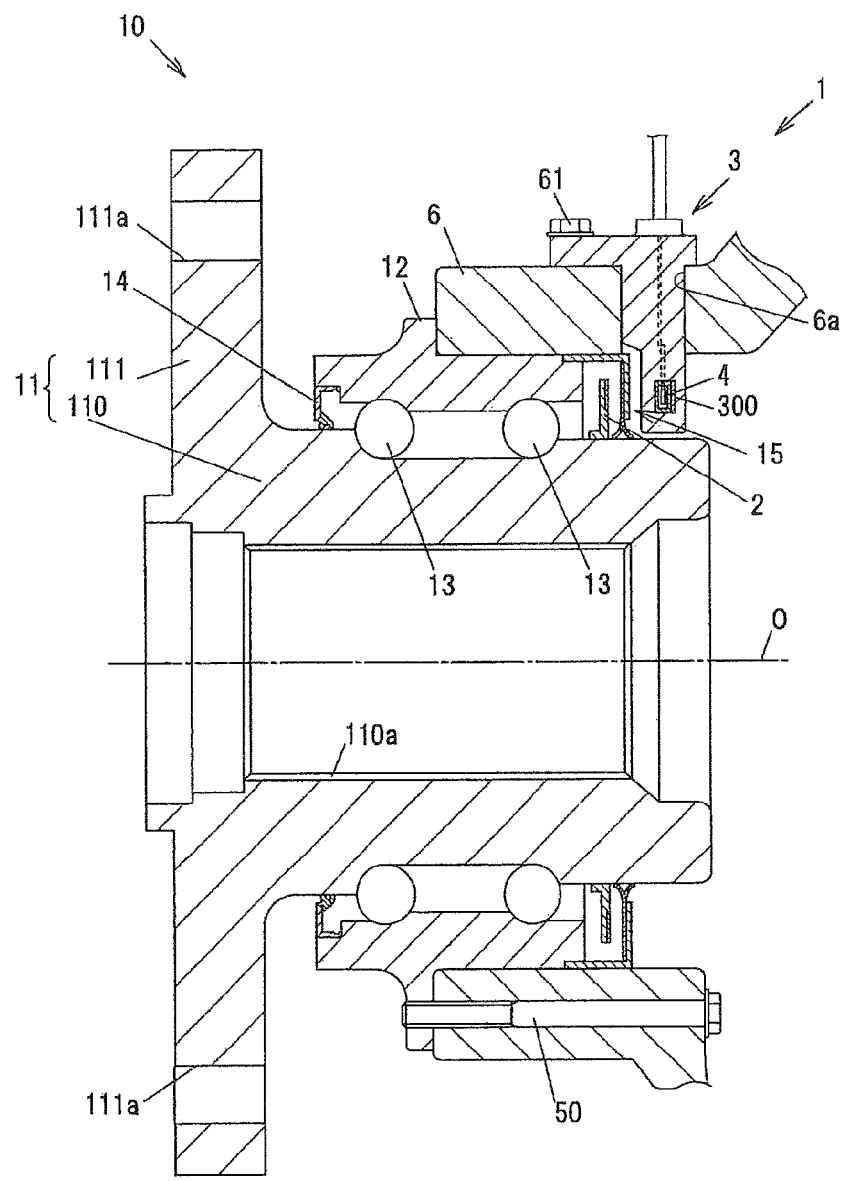
FIG. 1 is a cross sectional view showing a rotation detector in a first embodiment of the present invention and a configuration example of a wheel bearing device having the rotation detector.
Figure 2:
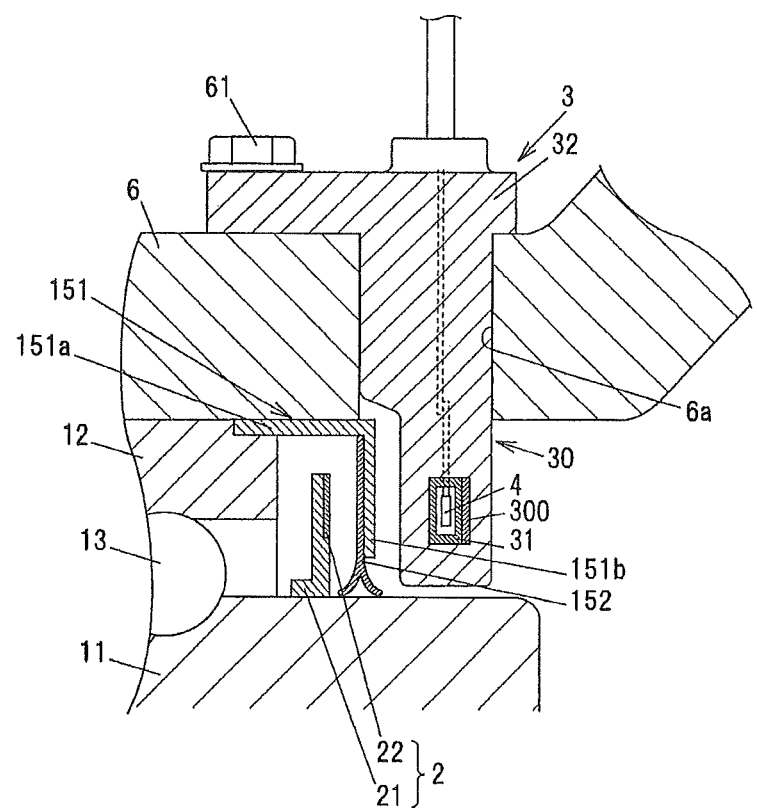
FIG. 2 is a partial enlarged view of FIG. 1.
Figure 3:
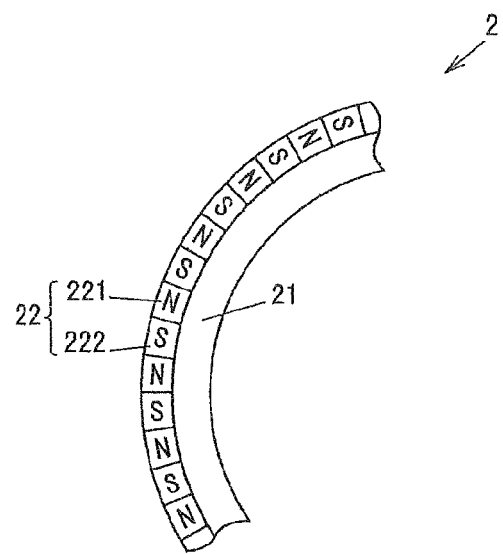
FIG. 3 is a partial enlarged view showing a magnetic body.

FIG. 1 is a cross sectional view showing a rotation detector 1 in the first embodiment of the invention and a configuration example of a wheel bearing device 10 for vehicle having the rotation detector 1. FIG. 2 is a partial enlarged view of FIG. 1. FIG. 3 is a partial enlarged view showing a magnetic body 22.

(Configuration of Wheel Bearing Device 10)

The wheel bearing device 10 is provided with an inner race 11 having a cylindrical main body 110 and a flange portion 111 to be attached to a wheel, an outer race 12 arranged on the outer peripheral side of the main body 110 of the inner race 11, plural rolling elements 13 arranged between the inner race 11 and the outer race 12, and the rotation detector 1 for detecting a speed of rotation of the inner race 11 relative to the outer race 12.

A spline fitting portion 110a for coupling to a drive shaft along a rotation axis O thereof is formed at the center of the main body 110 of the inner race 11. The flange portion 111 of the inner race 11 is integrally formed with the main body 110 so as to protrude radially outward of the main body 110. Plural through-holes 111a, into which bolts for attaching to a wheel (not shown) are press-fitted, are formed on the flange portion 111.

The outer race 12 is formed in a cylindrical shape and is fixed by plural bolts 61 (only one is shown in FIG. 1) to a knuckle 6 connected to a vehicle body via a suspension. A through-hole 6a for attaching a sensor module 3 (described later) is formed on the knuckle 6.

An annular space between the inner race 11 and the outer race 12 is sealed with a first sealing member 14 and a second sealing member 15. The first sealing member 14 is arranged on the flange portion 111 side of the inner race 11, and the second sealing member 15 is arranged opposite thereto (on the vehicle body side). The second sealing member 15 is composed of a cored bar 151 having an L-shaped cross section and an elastic member 152 bonded to the cored bar 151 by vulcanization, and a cylindrical portion 151a formed at the outer circumference of the cored bar 151 is press-fitted onto the outer peripheral surface of the outer race 12. The elastic member 152 is bonded to a flange 151b extending inward from an edge of the cylindrical portion 151a by, e.g., vulcanization. The cored bar 151 is formed of a non-magnetic metal such as austenitic stainless or aluminum.

The rotation detector 1 has a magnetic encoder 2 fixed to the outer periphery of the main body 110 of the inner race 11, and the sensor module 3 for detecting a change in magnetic field with rotation of the magnetic encoder 2. The magnetic encoder 2 has annular supporting portion 21 formed of a non-magnetic material and fixed to the outer peripheral surface of the main body 110 of the inner race 11, and the annular magnetic body 22 supported by the supporting portion 21. As shown in FIG. 3, the magnetic body 22 has plural N-poles 221 and plural S-poles 222 alternately provided along circumferential direction, and rotates with a wheel and the inner race 11.

The sensor module 3 has a resin case 30, a magnetic field sensor 4, and a yoke 300 as a magnetic body arranged on the magnetic field sensor 4 on a side opposite to the magnetic encoder 2. The resin case 30 has a container case 31 formed of a resin and housing the magnetic field sensor 4, and a molded body 32 formed of a mold resin molded so as to contain at least a portion of the container case 31. The sensor module 3 is fixed to the knuckle 6 by the bolt 61.

The rotation detector 1 detects magnetic field strength changing due to the rotation of the magnetic encoder 2 using the magnetic field sensor 4 of the sensor module 3, and outputs a signal corresponding to the magnetic field strength. When the wheel rotates, the inner race 11 and the magnetic encoder 2 rotate about the rotation axis O with the rotation of the wheel and this causes a change in the strength of the magnetic field of the magnetic encoder 2 to be detected by the magnetic field sensor 4. Therefore, it is possible to obtain a rotation speed of the wheel based on a cycle of change in the signal output from the rotation detector 1.

(Configuration of Sensor Module 3)

Figure 4:
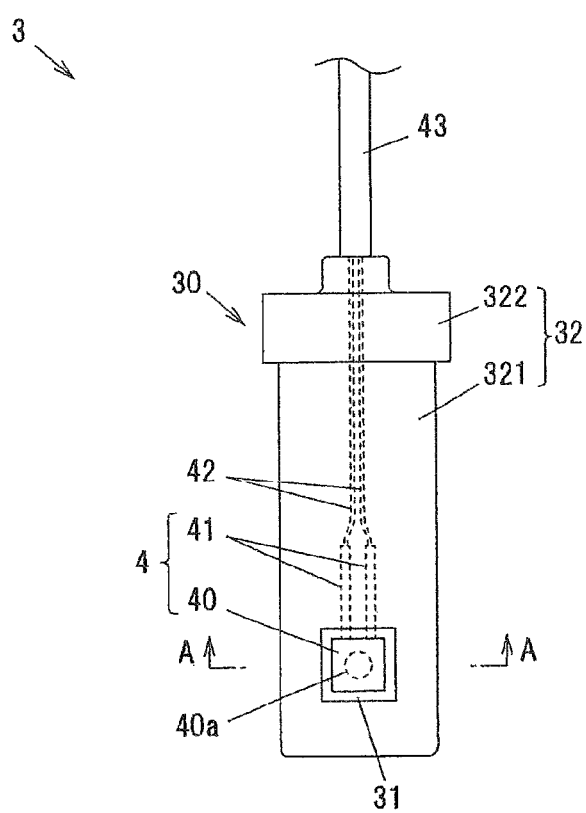
FIG. 4 is a front view showing a sensor module in the first embodiment of the invention.

FIG. 4 is a front view showing the sensor module 3 in the first embodiment of the invention. In FIG. 4, the container case 31 and the magnetic field sensor 4 inside the resin case 30 are respectively indicated by a solid line and a dashed line for the purpose of the explanation.

The magnetic field sensor 4 has a sensor main body 40 including a magnetic field sensing element (Hall element) 40a for detecting magnetic flux density which changes due to the rotation of the magnetic encoder 2, and plural lead wires 41 (two in the first embodiment) led out from the sensor main body 40. The plural lead wires 41 are respectively connected by soldering or welding, etc., to plural electric wires 42 included in a cable 43 extending out from the resin case 30.

The sensor main body 40 of the magnetic field sensor 4 is housed in the container case 31. The container case 31, the plural lead wires 41 led out from the container case 31 and the plural electric wires 42 are molded together in the molded body 32.

The molded body 32 is formed of a mold resin which is molded to include the container case 31 and the yoke 300 without coming into contact with the sensor main body 40 of the magnetic field sensor 4. In more detail, the molded body 32 integrally has a main body portion 321 molded to include the container case 31 as well as the yoke 300, and a fixing portion 322 to be fixed to the knuckle 6 by the bolt 61. The plural electric wires 42 are bundled inside the main body portion 321 and are housed inside a sheath of the cable 43.

(Configuration of Container Case 31)

Figure 5A:
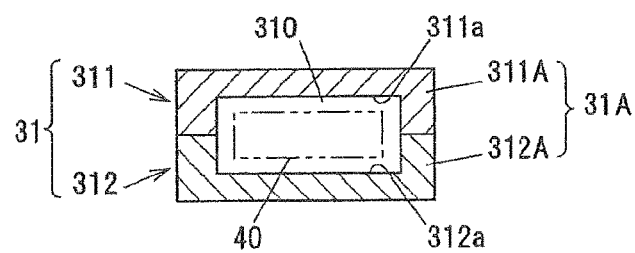
Figure 5B:
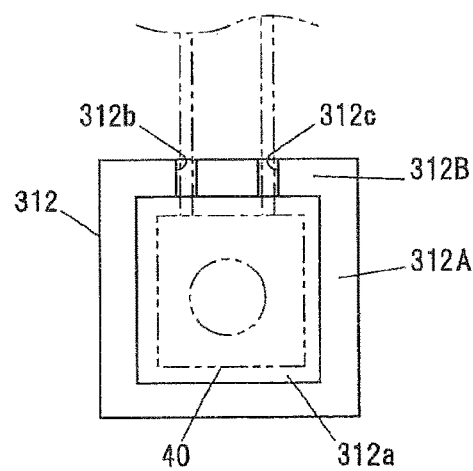
Figure 5C:
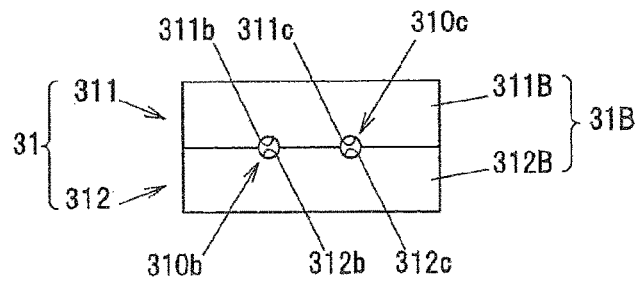

FIGS. 5A to 5C show the container case 31 constituting the sensor module of FIG. 4, wherein FIG. 5A is a cross sectional view showing the container case 31 (not including the molded body) taken on line A-A, FIG. 5B is a front view showing a second resin member 312 constituting the container case 31, and FIG. 5C is a top view showing the container case 31. In FIGS. 5A and 5B, the magnetic field sensor 4 is indicated by a dash-dot-dot line for the purpose of the explanation.

The container case 31 is formed of, e.g., a hard resin such as ABS resin and is formed by combining a first resin member 311 with the second resin member 312. The first resin member 311 and the second resin member 312 can be formed by, e.g., injection molding.

The first resin member 311 has a housing portion 311A for housing the sensor main body 40 of the magnetic field sensor 4 and a holding portion 311B for holding the plural lead wires 41. Likewise, the second resin member 312 has a housing portion 312A for housing the sensor main body 40 of the magnetic field sensor 4 and a holding portion 312B for holding the plural lead wires 41.

A recessed portion 311a for housing the sensor main body 40 of the magnetic field sensor 4 is formed on the housing portion 311A of the first resin member 311. Likewise, a recessed portion 312a for housing the sensor main body 40 of the magnetic field sensor 4 is formed on the housing portion 312A of the second resin member 312.

A container part 31A of the container case 31 is formed by combining the housing portion 311A of the first resin member 311 with the housing portion 312A of the second resin member 312. Then, a rectangular parallelepiped-shaped housing space 310 is formed by combining the recessed portion 311a of the first resin member 311 with the recessed portion 312a of the second resin member 312.

The container case 31 is formed so that the container part 31A surrounds the entire sensor main body 40. Then, the molded body 32 seals the container part 31A of the container case 31.

Plural (two in the first embodiment) holding grooves (a first holding groove 311b and a second holding groove 311c)

for holding the plural lead wires 41 are formed on the holding portion 311B of the first resin member 311. Likewise, plural (two in the first embodiment) holding grooves (a first holding groove 312b and a second holding groove 312c) for holding the plural lead wires 41 are formed on the holding portion 312B of the second resin member 312.

As shown in FIG. 5C, a holding portion 31B of the container case 31 is formed by combining the holding portion 311B of the first resin member 311 with the holding portion 312B of the second resin member 312. Then, a first holding hole 310b having a cylindrical shape is formed by combining the first holding groove 311b of the first resin member 311 with the first holding groove 312b of the second resin member 312, and a second holding hole 310c having a cylindrical shape is formed by combining the second holding groove 311c of the first resin member 311 with the second holding groove 312c of the second resin member 312.

The magnetic field sensor 4 is configured that the plural lead wires 41 is supported by the first and second holding holes 310b and 310c of the container part 31B and the sensor main body 40 is thereby positioned and fixed inside the housing space 310 of the container part 31A in a state that the entire outer periphery of the sensor main body 40 is not in contact with the container case 31.

(Method of Manufacturing Sensor Module 3)

Next, a method of manufacturing the sensor module 3 will be described.

The method of manufacturing the sensor module 3 includes a first step in which, of the sensor main body 40 and the plural lead wires 41, at least the sensor main body 40 is housed in the container part 31A of the container case 31, and a second step in which the molded body 32 is obtained by molding a mold resin so as to contain the container case 31 without contact of a molten resin with the sensor main body 40.

In the first step, the magnetic field sensor 4 is arranged on the recessed portion 312a of the second resin member 312 and the plural lead wires 41 are respectively arranged in the first and second holding grooves 312b and 312c. Next, the first resin member 311 is combined with the second resin member 312 on which the magnetic field sensor 4 is arranged, thereby forming the container case 31. As a result, the plural lead wires 41 are held by the first and second holding holes 310b and 310c and the sensor main body 40 is arranged inside the housing space 310 in a state that the entire outer peripheral portion of the sensor main body 40 is not in contact with the container case 31.

Next, tip portions (on the opposite side to the sensor main body 40) of the plural lead wires 41 are respectively connected to the electric wires 42.

In the second step, the electric wires 42 and the container case 31 housing the magnetic field sensor 4 connected to the lead wires 41 are placed in a molding space of a mold used to form the molded body 32, and a molten resin is then poured into the molding space. At this time, the sensor main body 40 is arranged in the housing space 310 in a state that the entire outer peripheral portion of the sensor main body 40 is not contact with the container case 31, i.e., the sensor main body 40 is covered by the container part 31A of the container case 31. In this state, the molten resin does not flow into the housing space 310 and thus does not comes into contact with the sensor main body 40. As such, the container case 31 is integrated with the molded body 32, and the resin case 30 is thereby formed.

(Functions and Effects of the First Embodiment)

The following functions and effects are obtained in the first embodiment.

(1) Since the sensor main body 40 of the magnetic field sensor 4 is housed in the container case 31 and does not contact with the molten resin, it is possible to suppress the effect of heat of the molten resin during molding of the molded body 32. As a result, it is possible to suppress deterioration in detection accuracy of the magnetic field sensing element 40a and to ensure reliability.

(2) The sensor main body 40 of the magnetic field sensor 4 is supported inside the housing space 310 of the container case 31 by holding the plural lead wires 41 in the first and second holding holes 310b and 310c formed on the holding portion 31B of the container case 31. In other words, since the sensor main body 40 is supported without being in contact with the container case 31, it is possible to prevent heat of the molten resin during molding of the molded body 32 from being directly transferred from the container case 31 to the sensor main body 40. As a result, a decrease in detection accuracy of the magnetic field sensor 4 due to heat during molding of the molded body 32 can be suppressed more reliably.

Second Embodiment

Next, the second embodiment of the invention will be described in reference to FIGS. 6 and 7.

Figure 6A:
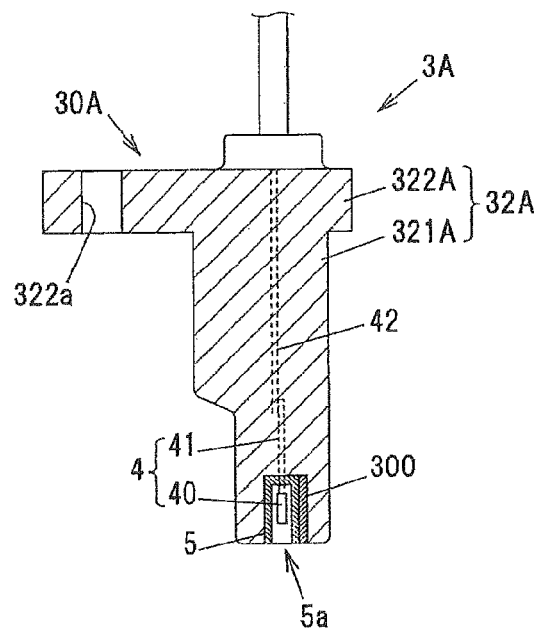
Figure 6B:
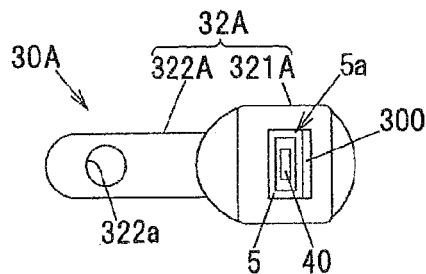

FIGS. 6A and 6B show a sensor module in the second embodiment of the invention wherein FIG. 6A is a cross sectional view showing a sensor module 3A and FIG. 6B is a bottom view showing the sensor module 3A. Constituent elements having the same functions as those described in the first embodiment are denoted by the same or corresponding reference numerals in FIG. 6A and the overlapping explanation thereof will be omitted.

The sensor module 3A in the second embodiment has a resin case 30A, the magnetic field sensor 4, and the yoke 300. The resin case 30A has a container case 5 formed of a resin and housing the magnetic field sensor 4, and a molded body 32A formed of a mold resin molded so as to contain the container case 5. The molded body 32A integrally has a main body portion 321A molded to include the container case 5 as well as the yoke 300, and a fixing portion 322A having a bolt insertion hole 322a for inserting a fixing bolt.

The sensor main body 40 of the magnetic field sensor 4 is housed inside the container case 5. An opening 5a, through which the sensor main body 40 housed in the container case 5 can be seen from the outside, is formed on the bottom surface of the resin case 30A which faces the outer peripheral surface of the inner race 11 (shown in FIGS. 1 and 2).

Figure 7A:
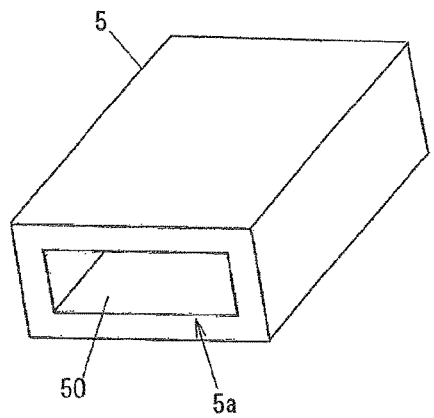
Figure 7B:
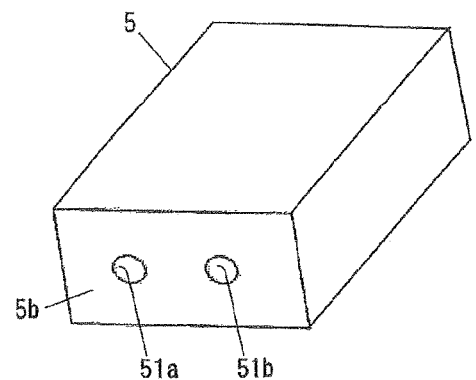
Figure 7C:
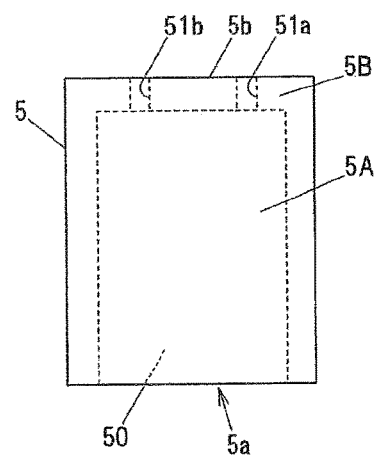

FIGS. 7A to 7C show the container case 5 constituting the sensor module in the second embodiment, wherein FIG. 7A is a perspective view showing the container case 5, FIG. 7B is a perspective view showing the container case 5 when viewing from the opposite side to the viewing direction in FIG. 7A and FIG. 7C is a side view showing the container case 5. In FIG. 7C, a structure inside the container case 5 is indicated by a dashed line.

The container case 5 has a rectangular parallelepiped shape having a housing space 50 thereinside to house the sensor main body 40 of the magnetic field sensor 4 and the opening 5a formed on one of the surfaces thereof. A first holding hole 51a and a second holding hole 51b respectively holding the plural (two) lead wires 41 of the sensor main body 40 inserted therethrough are formed on a bottom surface 5b opposite to the surface having the opening 5a.

As such, the container case 5 integrally has a housing portion 5A having the housing space 50 and a holding portion 5B having the first and second holding holes 51a and 51b for holding the plural lead wires 41. The magnetic field sensor 4 is configured that the plural lead wires 41 is held by the holding portion 5B and the sensor main body 40 is thereby supported inside the housing space 50 of the housing portion 5A.

When manufacturing the sensor module 3A, the plural lead wires 41 are inserted from the opening 5a and the sensor main body 40 is then placed inside the housing space 50 while inserting the plural lead wires 41 through the first and second holding holes 51a and 51b. Then, the tip portions of the lead wires 41 after passing through the first and second holding holes 51a and 51b are respectively connected to the electric wires 42. After that, the electric wires 42 and the container case 5 housing the sensor main body 40 are arranged in the molding space of the mold used to form the molded body 32A, and a molten resin is poured in the state that the opening 5a is blocked by being pushed against an inner surface, etc., of the mold. The resin case 30, in which the container case 5 is integrated with the molded body 32A, is thereby formed.

The same functions and effects as the first embodiment are also obtained in the second embodiment. In addition, even when the sensor main body 40 generates heat during use of the sensor module 3A, it is possible to dissipate the heat from the opening 5a and overheat of the magnetic field sensor 4 is thus suppressed. As a result, it is possible to maintain detection accuracy of the magnetic field sensor 4 more reliably.

Summary of the Embodiments

Technical ideas understood from the embodiments will be described below citing the reference numerals, etc., used for the embodiments. However, each reference numeral, etc., described below is not intended to limit the constituent elements in the claims to the members, etc., specifically described in the embodiments.

[1] A sensing device (1), comprising a sensor (40) that comprises a sensor main body (40) comprising a sensing element (40a) and a plurality of lead wires (41) led out from the sensor main body (40); a housing member (container case 31, 5) that comprises a container part (31A, 5A) comprising the sensor main body (40), and a molded body (32, 32A) that comprises a mold resin molded so as to include at least a part of the housing member (container case 31, 5) without contacting with the sensor main body (40).

The sensing device (1) set forth in [1], wherein the housing member (container case 31) is formed such that the container part (31A) surrounds an entirety of the sensor main body (40), and the molded body (32) seals the container part (31A) of the housing member (container case 31).

The sensing device (1) set forth in [1], wherein the housing member (container case 5) comprises an opening (5a) formed on the container part (5A) so as to allow the sensor main body (40) to be exposed, and the molded body (32A) is molded without covering the opening (5a).

[4] The sensing device (1) set forth in any one of the [1] to [3], wherein the housing member (container case 31, 5) comprises a holding portion (31B, 5B) holding the lead wires (41), and the sensor (4) is configured such that the sensor main body (40) is supported in a housing space (310, 50) of the container part (31A, 5A) through the lead wires (41) held by the holding portion (31B, 5B).

[5] A method for manufacturing a sensing device (1), comprising a first step for housing at least a sensor main body (40) of a sensor (4) in a container part (31A, 5A) of a housing member (container case 31, 5), the sensor comprising the sensor main body (40) comprising a sensing element (40a) and a plurality of lead wires (41) led out from the sensor main body (40), and a second step for molding a mold resin so as to include at least a part of the housing member (container case 31, 5) without contacting a molten resin with the sensor main body (40).

Although the embodiments of the invention have been described, the invention according to claims is not to be limited to the embodiments described above. Further, please note that all combinations of the features described in the embodiments are not necessary to solve the problem of the invention.

Although one magnetic field sensor 4 is arranged in the container case 31 or 5 in the first and second embodiments, it is not limited thereto. Plural magnetic field sensors 4 may be housed in the container case 31 or 5.

In addition, the shapes of the main body portions 321, 321A and the fixing portions 322, 322A of the molded bodies 32 and 32A are not limited as long as the container case 31 or 5 and the lead wires 41 are placed together in the molded resin.

In addition, although the Hall element for detecting a magnetic field has been described as a sensing element in the first and second embodiments, it is not limited thereto. The sensing element may detect a quantity state such as temperature, humidity, acceleration rate or pressure.

INDUSTRIAL APPLICABILITY

The invention provides a sensing device that can prevent a decrease in detection accuracy of a sensor caused by heat during resin molding of the sensor.

REFERENCE SIGNS LIST

1: ROTATION DETECTOR
2: MAGNETIC ENCODER
3, 3A: SENSOR MODULE
4: MAGNETIC FIELD SENSOR
5: CONTAINER CASE
5A: CONTAINER PART
5B: HOLDING PORTION
5a: OPENING
5b: BOTTOM SURFACE
6: KNUCKLE
6a: THROUGH-HOLE
10: WHEEL BEARING DEVICE
11: INNER RACE
12: OUTER RACE
13: ROLLING ELEMENT
14: FIRST SEALING MEMBER
15: SECOND SEALING MEMBER
21: SUPPORTING PORTION
22: MAGNETIC BODY
30, 30A: RESIN CASE
31: CONTAINER CASE
31A: CONTAINER PART
31B: HOLDING PORTION
32, 32A: MOLDED BODY
40: SENSOR MAIN BODY
40a: MAGNETIC FIELD SENSING ELEMENT
41: LEAD WIRE
42: ELECTRIC WIRE

43: CABLE
50: HOUSING SPACE
51a, 51b: FIRST AND SECOND HOLDING HOLES
61: BOLT
110: MAIN BODY
110a: SPLINE FITTING PORTION
111: FLANGE PORTION
111a: THROUGH-HOLE
151: CORED BAR
151a: CYLINDRICAL PORTION
151b: FLANGE
152: ELASTIC MEMBER
221: N-POLE
222: S-POLE
300: YOKE
310: HOUSING SPACE
310b, 310c: FIRST AND SECOND HOLDING HOLES
311: FIRST RESIN MEMBER
311A: HOUSING PORTION
311B: HOLDING PORTION
311a: RECESSED PORTION
311b, 311c: FIRST AND SECOND HOLDING GROOVES
312: SECOND RESIN MEMBER
312A: HOUSING PORTION
312B: HOLDING PORTION
312a: RECESSED PORTION
312b, 312c: FIRST AND SECOND HOLDING GROOVES
321, 321A: MAIN BODY PORTION
322, 322A: FIXING PORTION
322a: BOLT INSERTION HOLE

The invention claimed is:

1. A sensing device, comprising:
a sensor that comprises a sensor main body comprising a sensing element and a plurality of lead wires led out from the sensor main body;
a housing member that comprises a holding portion for holding the plurality of lead wires;
a molded body that comprises a mold resin molded so as to include at least a part of the housing member without contacting with the sensor main body; and
a holding hole for holding the plurality of lead wires inserted through the holding hole,
wherein the housing member comprises an opening formed on the molded body to allow the sensor main body to be exposed,
wherein the molded body is molded without covering the opening,
wherein the sensor main body is seen from outside the molded body through a bottom surface of the molded body,
wherein an inner wall surface of the housing member is not in contact with the sensor main body, and
wherein the sensor main body is entirely located between the opening and the holding portion.

2. The sensing device according to claim 1, wherein the housing member is formed such that a container part surrounds an entirety of the sensor main body, and
wherein the molded body seals the container part of the housing member.

3. The sensing device according to claim 1, wherein the sensor is configured such that the sensor main body is supported in a housing space of a container part through the lead wires held by the holding portion.

4. A method for manufacturing a sensing device, the method comprising:
housing at least a sensor main body of a sensor in a molded body, the sensor comprising the sensor main body comprising a sensing element and a plurality of lead wires led out from the sensor main body;
holding the plurality of lead wires by a holding portion of a housing member, the housing member including a holding hole for holding the plurality of lead wires inserted through the holding hole; and
molding a mold resin so as to include at least a part of the molded body without contacting a molten resin with the sensor main body,
wherein the housing member comprises an opening formed on the molded body to allow the sensor main body to be exposed,
wherein the molded body is molded without covering the opening,
wherein the sensor main body is seen from outside the molded body through a bottom surface of the molded body,
wherein an inner wall surface of the housing member is not in contact with the sensor main body, and
wherein the sensor main body is entirely located between the opening and holding portion.

5. The sensing device according to claim 2, wherein the sensor is configured such that the sensor main body is supported in a housing space of the container part through the lead wires held by the holding portion.

6. The sensing device according to claim 1, wherein the sensor main body is supported without being in contact with the housing member.

7. The sensing device according to claim 1, wherein the housing member further comprises a plurality of holding holes for holding the plurality of lead wires, and the sensor main body is supported without being in contact with the housing member by the plurality of lead wires being held by the plurality of holding holes.

8. The sensing device according to claim 1, wherein the opening is located on the bottom surface of the molded body, and the molded body is disposed on a top surface of the housing member.

9. The method according to claim 4, wherein the sensor main body is supported without being in contact with the housing member.

10. The method according to claim 4, wherein the housing member further comprises a plurality of holding holes for holding the plurality of lead wires, and the sensor main body is supported without being in contact with the housing member by the plurality of lead wires being held by the plurality of holding holes.

11. The method according to claim 4, wherein the sensor main body is located between the opening and the holding portion.

12. The method according to claim 4, wherein the opening is located on the bottom surface of the molded body, and the molded body is disposed on a top surface of the housing member.

13. A sensing device, comprising:
a sensor that comprises a sensor main body comprising a sensing element and a plurality of lead wires led out from the sensor main body; and
a resin case comprising:
a housing member that comprises a holding portion for holding the plurality of lead wires;
a molded body that comprises a mold resin molded to include at least a part of the housing member without contacting with the sensor main body; and
a holding hole for holding the plurality of lead wires inserted through the holding hole, wherein the resin case comprises an opening to allow the sensor main body to be exposed to an outside of the resin case, wherein the molded body is molded without covering the opening, wherein an inner wall surface of the housing member is not in contact with the sensor main body, and wherein the sensor main body is entirely located between the opening and the holding portion.

14. The sensing device according to claim 13, wherein the housing member further comprises a plurality of holding holes for holding the plurality of lead wires, and the sensor main body is supported without being in contact with the housing member by the plurality of lead wires being held by the plurality of holding holes.

15. The sensing device according to claim 1, wherein the sensor main body is housed inside the housing member to be spaced with a distance from all inner periphery surfaces of the housing member.

16. The sensing device according to claim 1, wherein the sensor main body is housed inside the housing member such that an entirety of the sensor main body is spaced apart from the housing member.

17. The method according to claim 4, wherein the sensor main body is housed inside the housing member to be spaced with a distance from all inner periphery surfaces of the housing member.

18. The sensing device according to claim 13, wherein the sensor main body is housed inside the housing member to be spaced with a distance from all inner periphery surfaces of the housing member.

19. The sensing device according to claim 1, wherein the sensor main body is not protruded from the opening.

20. The sensing device according to claim 1, wherein a tip surface of the sensor main body does not protrude from a tip surface of the molded body, the tip surface of the molded body including the opening and facing the tip surface of the sensor main body.

* * * * *